(12) United States Patent
Peng et al.

(10) Patent No.: US 12,381,561 B2
(45) Date of Patent: Aug. 5, 2025

(54) CIRCUITS AND METHODS FOR ACCESSING SIGNALS IN INTEGRATED CIRCUITS

(71) Applicant: Intel Corporation, Santa Clara, CA (US)

(72) Inventors: Yi Peng, Newark, CA (US); Brandon Gordon, Campbell, CA (US); Mahesh A. Iyer, Fremont, CA (US); Krishna Nagar, Union City, CA (US)

(73) Assignee: Altera Corporation, San Jose, CA (US)

( * ) Notice: Subject to any disclaimer, the term of this patent is extended or adjusted under 35 U.S.C. 154(b) by 753 days.

(21) Appl. No.: 17/525,894

(22) Filed: Nov. 13, 2021

(65) Prior Publication Data

US 2022/0077856 A1 Mar. 10, 2022

(51) Int. Cl.
*H03K 19/177* (2020.01)
*G06F 30/343* (2020.01)

(52) U.S. Cl.
CPC ......... *H03K 19/177* (2013.01); *G06F 30/343* (2020.01)

(58) Field of Classification Search
CPC .............................. G06F 30/343; H03K 19/177
See application file for complete search history.

(56) References Cited

U.S. PATENT DOCUMENTS

| | | | | |
|---|---|---|---|---|
| 7,350,121 B2 * | 3/2008 | Creigh | ............... | G01R 31/3177 714/724 |
| 7,701,247 B1 * | 4/2010 | Nelson | ............. | H03K 19/17764 326/38 |
| 8,914,681 B2 * | 12/2014 | Bailey | ................ | G01R 31/3177 714/39 |
| 9,494,967 B2 * | 11/2016 | Hutchings | ........ | H03K 19/17736 |
| 10,488,461 B2 * | 11/2019 | Oster | ............... | G01R 31/31725 |
| 2002/0194543 A1 * | 12/2002 | Veenstra | ................. | G06F 11/27 714/E11.169 |
| 2011/0047423 A1 * | 2/2011 | Bailey | ................. | G06F 11/2294 714/724 |
| 2011/0206176 A1 * | 8/2011 | Hutchings | ............... | G06M 3/00 377/26 |
| 2015/0278418 A1 * | 10/2015 | Kodavalla | ............... | G06F 30/34 716/117 |

* cited by examiner

*Primary Examiner* — Seokjin Kim
(74) *Attorney, Agent, or Firm* — InventIQ Legal LLP; Steven J. Cahill (57) ABSTRACT

An integrated circuit includes a monitored circuit and a signal analyzer circuit. The signal analyzer circuit includes a logic circuit that determines if a condition signal satisfies a condition to generate an output signal. A first-in-first-out (FIFO) buffer circuit stores opportunistic data indicated by a monitored signal received from the monitored circuit in response to the output signal indicating if the condition signal satisfies the condition. A communication channel transmits the opportunistic data stored in the FIFO buffer circuit outside the integrated circuit.

20 Claims, 4 Drawing Sheets

CIRCUITS AND METHODS FOR ACCESSING SIGNALS IN INTEGRATED CIRCUITS

FIELD OF THE DISCLOSURE

The present disclosure relates to electronic integrated circuits, and more particularly, to circuits and methods for accessing signals in integrated circuits.

BACKGROUND

In the field of electronics, various electronic design automation (EDA) tools are useful for automating the process by which integrated circuits, multi-chip modules, boards, etc., are designed and manufactured. In particular, electronic design automation tools are useful in the design of standard integrated circuits, custom integrated circuits, and configurations for programmable integrated circuits. Programmable integrated circuits may be programmable by a customer to produce a custom design for the integrated circuit. After a programmable integrated circuit (IC) has been programmed with a custom design and is operating within a working system, it is important to be able to debug the IC, for example, by capturing the values of signal traces within the custom design.

DETAILED DESCRIPTION

As significant limitation for users that attempt to debug custom designs for programmable integrated circuits (ICs) has been the high throughput needed to capture signal traces within the custom designs (e.g., tens of gigabits per second). Previously, there was no feasible mechanism to give designers of programmable ICs full visibility into their custom designs at the signal frequencies of normal operation. Previously known high throughput debug communication channels have not provided enough bandwidth to continuously capture signals in the IC, given the high frequency operating speed of circuitry in the core of the IC, and the large number of signals that need to be captured.

An integrated circuit (IC) may include an embedded logic analyzer circuit that uses embedded memory in the IC running at the same frequency as signals being monitored in the IC to provide matching bandwidth that guarantees the signals will be captured. If the embedded memory provides very limited storage capability, a user may have to make a trade-off between the number of captured signals and the number of samples of the signals captured. This trade-off results in users either capturing the signals they need, but without the needed time period of IC operation to fully understand the problem, or capturing a sufficient time period of IC operation, but without the full complement of signals needed to understand what logic circuits misbehaved in the custom design.

According to some examples provided herein, a signal analyzer circuit provides two types of controls for a user to describe the importance of data to be captured in an IC system. According to the first type of control, signals in the IC system that are critical to understanding the state of the IC system are captured continuously in response to a capture trigger or storage qualifier condition occurring. According to the second type of control, signals in the IC system that are opportunistic are sampled before or after a condition, such as a trigger or storage qualifier condition, has occurred in order to help a user understand the context for how the design for the IC reached a particular state and how the design behaves before or after the condition has been reached. With these two types of controls defined by a user, the signal analyzer circuit can opportunistically transmit as much data as the communication bandwidth allows, while discarding non-critical data when the communication channel is stalled. The signal analyzer circuit extends a designer's visibility into their design for the IC using the available debug communication channel or storage bandwidth. The data captured by the signal analyzer circuit may be transmitted to a memory circuit that is external to the IC.

Figure 1:
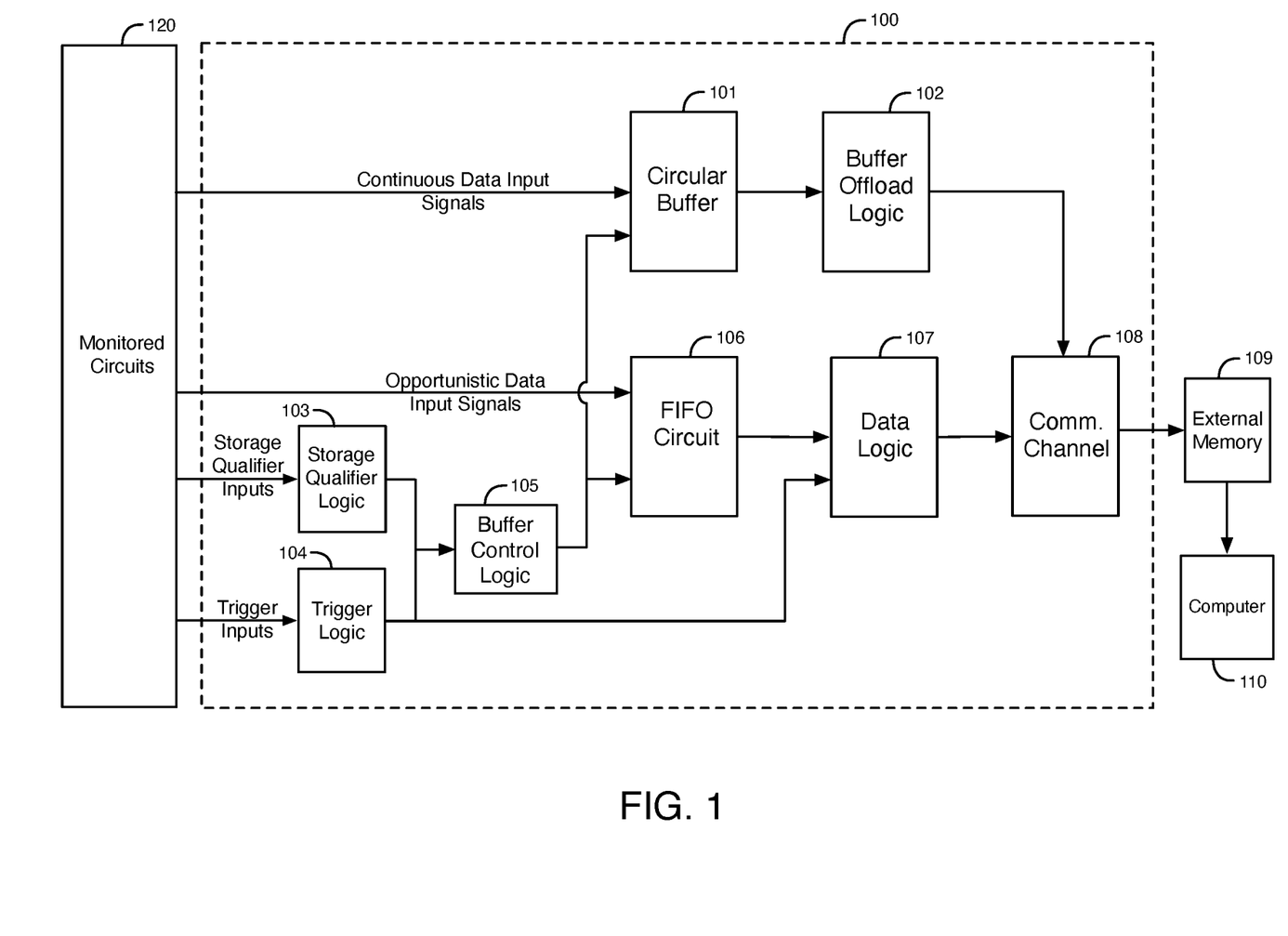
FIG. 1 illustrates an example of a signal analyzer circuit.

FIG. 1 illustrates an example of a signal analyzer circuit 100. Signal analyzer circuit 100 includes a circular buffer circuit 101, a buffer offload logic circuit 102, a storage qualifier logic circuit 103, a trigger logic circuit 104, a buffer control logic circuit 105, a first-in-first-out (FIFO) buffer circuit 106, a data logic circuit 107, and a communication channel 108. Signal analyzer circuit 100 may be in any type of integrated circuit (IC), such as a programmable integrated circuit (IC), a microprocessor, a graphics processing unit, an application specific IC, a memory IC, etc. Programmable ICs include any integrated circuits that may be programmed to perform desired functions, including programmable logic arrays (PLAs), programmable array logic (PAL), field programmable gate arrays (FPGAs), and programmable logic devices (PLDs).

According to various exemplary implementations of Figure (FIG. 1, the circuits 101-108 in the signal analyzer circuit 100 may be implemented by configuring programmable logic circuits (i.e., soft logic) in a programmable IC, using hardwired non-programmable logic circuits (i.e., hard logic), or a combination of soft and hard logic. FIG. 1 also illustrates monitored circuits 120 that are in the same IC as the signal analyzer circuit 100. The monitored circuits 120 may be, for example, programmable logic circuits configured to implement a custom design in a programmable IC. FIG. 1 also shows a memory integrated circuit 109 and a computer 110 that are external to the IC containing signal analyzer circuit 100 and circuits 120.

The signal analyzer circuit 100 may be controlled by a user from computer 110 external to the IC containing signal analyzer circuit 100. Signal analyzer circuit 100 operates to capture any of a variety of internal signals within the IC from monitored circuits 120. The signal analyzer circuit 100 receives a variety of input signals from monitored circuits 120 within the IC and outside of signal analyzer circuit 100. For example, the signal analyzer circuit 100 receives storage qualifier input signals and trigger input signals from monitored circuits 120 in the IC. The storage qualifier and trigger input signals may be, for example, signals generated by one or more of the monitored circuits 120 that are being monitored to determine when these input signals satisfy one or more pre-defined conditions that are used as preconditions to writing and/or reading data to/from the circular buffer circuit 101 and the FIFO buffer circuit 106, as described below.

Storage qualifier logic circuit 103 receives storage qualifier input signals from one or more of the monitored circuits 120 in the IC. The storage qualifier input signals are signals from the monitored circuits 120 in the IC (e.g., signals from a custom design for a programmable IC) that a user wants to compare to one or more storage qualifier conditions using storage qualifier logic circuit 103. The storage qualifier logic circuit 103 may include a comparison circuit that compares the storage qualifier input signals to the storage qualifier conditions and that generates an output signal indicating when one or more of the storage qualifier input signals satisfy one or more of the storage qualifier conditions. The storage qualifier conditions may, for example, be used to measure when stored data in the IC equal predefined values.

Trigger logic circuit 104 receives trigger input signals from one or more of the monitored circuits 120 in the IC. The trigger input signals are signals from the monitored circuits 120 (e.g., signals from a custom design for a programmable IC) that a user wants to compare to one or more trigger conditions using trigger logic circuit 104. The trigger logic circuit 104 may include a comparison circuit that compares the trigger input signals to the trigger conditions and that generates an output signal indicating when one or more of the trigger input signals satisfy one or more of the trigger conditions. The trigger conditions may, for example, indicate when signals in the IC equal predefined values (e.g., using Boolean logic expressions).

The output signals of the storage qualifier logic circuit 103 and the trigger logic circuit 104 are provided to inputs of the buffer control logic circuit 105 and to inputs of the data logic circuit 107. The buffer control logic circuit 105 provides one or more output signals to circular buffer circuit 101 and FIFO buffer circuit 106 that indicate if one or more of the storage qualifier conditions and/or one or more of the trigger conditions monitored by circuits 103-104 have been satisfied.

Signal analyzer circuit 100 also receives continuous data input signals that are provided to one or more inputs of circular buffer circuit 101 from the monitored circuits 120 in the IC. As an example, the signal analyzer circuit 100 may be in a programmable IC, and the continuous data input signals may be signals that a user has selected to be tapped from programmable logic circuits configured to implement a custom design for the programmable IC. The continuous data input signals may be selected based on, for example, user input to provide visibility into the operation of the internal circuits of the IC for debugging purposes. The continuous data input signals are stored in memory circuits in the circular buffer circuit 101.

Circular buffer circuit 101 functions such that the data indicated by the continuous data input signals are sequentially stored in memory circuits in circular buffer circuit 100 starting at a beginning memory location, while the signal analyzer circuit 100 is running. As the memory circuits in circular buffer circuit 101 fill up with the data, circular buffer circuit 101 wraps back around to the beginning memory location, and the oldest data stored in circular buffer circuit 101 is overwritten by new data from the incoming continuous data input signals starting again at the beginning memory location.

In response to the output signals of the buffer control logic circuit 105 indicating that one or more of the trigger conditions monitored by circuits 103-104 have been satisfied, the data stored in circular buffer circuit 101 is provided to buffer offload logic circuit 102. Buffer offload logic circuit 102 provides the data received from circular buffer circuit 101 to external memory circuit 109 through the communication channel 108. The data received from buffer offload logic circuit 102 is stored in the external memory circuit 109 and may be subsequently provided to computer 110 for processing, analysis, and debugging by the user using software running on computer 110. The communication channel 108 may be any type of communication channel that uses any type of communication protocol, for example, a joint test action group (JTAG) channel, a Peripheral Component Interconnect Express (PCIe) channel, a universal serial bus (USB) channel, an Ethernet channel, double data rate (DDR) memory channel, an Advanced Extensible Interface (AXI) channel, a Compute Express Link (CXL) channel, etc. If the IC containing signal analyzer circuit 100 is a programmable IC, the type of communication protocol used by communication channel 108 may be changed using partial reconfiguration of the programmable logic circuits used to implement communication channel 108.

Signal analyzer circuit 100 also receives opportunistic data input signals that indicate opportunistic data. The opportunistic data input signals are provided to one or more inputs of FIFO buffer circuit 106 from the monitored circuits 120 in the IC. As an example, the signal analyzer circuit 100 may be in a programmable IC, and the opportunistic data input signals may be signals that a user has selected (e.g., using a user interface) to be tapped from programmable logic circuits (i.e., monitored circuits 120) configured to implement a custom design for the programmable IC. The opportunistic data input signals may augment the number of signals and/or the number of data samples from the monitored circuits 120 that signal analyzer circuit 100 can store and process. The signal analyzer circuit 100 may, for example, capture more data from the opportunistic data input signals than from the continuous data input signals.

The opportunistic data indicated by the opportunistic data input signals may be stored in memory circuits in FIFO buffer circuit 106 in a first-in-first-out manner in response to a clock signal. The FIFO buffer circuit 106 may, for example, transfer the opportunistic data from one clock domain to another clock domain. In some examples, storage qualifier conditions and/or trigger conditions monitored by logic circuits 103-104 control when the opportunistic data is stored in FIFO buffer circuit 106. Different priorities may, for example, be defined for each storage qualifier condition and for each trigger condition. Trigger conditions monitored by trigger logic circuit 104 may, e.g., have the highest priorities. According to these examples, FIFO buffer circuit 106 stores only a subset of the opportunistic data indicted by the opportunistic data input signals (e.g., in a subset of the clock cycles) that is selected based on the output signals of buffer control logic circuit 105 indicating that one or more of the trigger and/or storage conditions monitored by circuits 103-104 have been satisfied. Signal analyzer circuit 100 can vary which clock cycles of the opportunistic data are stored in FIFO buffer circuit 106.

The output signals of buffer control logic circuit 105 may define the number of samples of the opportunistic data that FIFO buffer circuit 106 stores before and after each storage qualifier condition and each trigger condition is satisfied. The samples of the opportunistic data that FIFO buffer circuit 106 stores before one of the storage qualifier or trigger conditions is satisfied is referred to as Pre-data. The samples of the opportunistic data that FIFO buffer circuit 106 stores after one of the storage qualifier or trigger conditions is satisfied is referred to as Post-data. The memory capacity of FIFO buffer circuit 106 (i.e., the maximum amount of data that can be stored in FIFO buffer circuit 106) equals the maximum of the Pre-data plus the Post-data (Pre-data+Post-data) for all of the storage qualifier and trigger conditions monitored by logic circuits 103-104.

Figure 2:
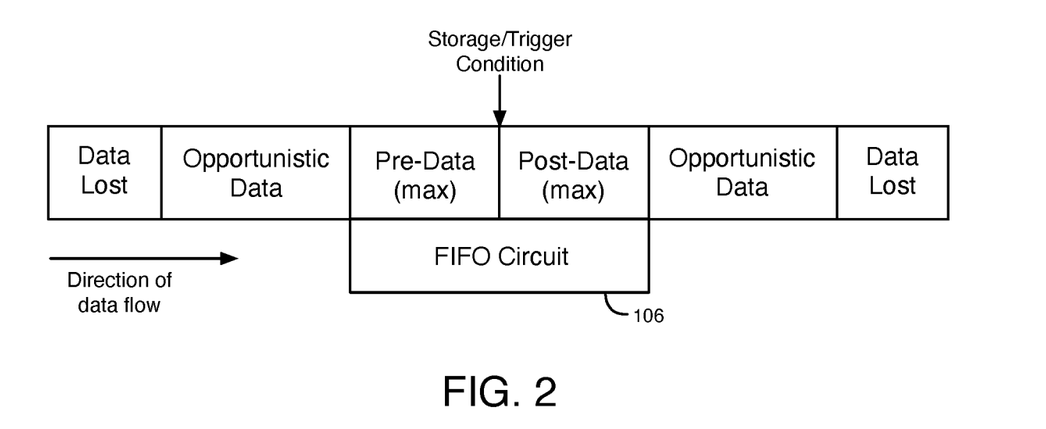
FIG. 2 is a diagram that illustrates an exemplary stream of opportunistic data that may be stored in the FIFO buffer circuit when trigger or storage qualifier conditions are applied in the signal analyzer circuit of FIG. 1.

FIG. 2 is a diagram that illustrates an exemplary stream of opportunistic data that may be stored in FIFO buffer circuit 106 when trigger or storage qualifier conditions are applied in signal analyzer circuit 100. As shown in FIG. 2, the Pre-data and the Post-data are stored in FIFO buffer circuit 106. As discussed above, the Pre-data is opportunistic data that occurs in the opportunistic data input signals prior to one of the storage qualifier or trigger conditions being satisfied. The Post-data is opportunistic data that occurs in the opportunistic data input signals after one of the storage qualifier or trigger conditions is satisfied. As discussed above, the output signals of buffer control logic circuit 105 may indicate when the storage qualifier and trigger conditions are satisfied. The output signals of buffer control logic circuit 105 may also indicate the amount of Pre-data and the amount of Post-data that is stored in FIFO buffer circuit 106. In the example of FIG. 2, the Pre-data and the Post-data together have the maximum amount of data that can be stored in FIFO buffer circuit 106 at one time. In this example, each of the Pre-data and the Post-data contains an amount of data equal to one-half of the storage capacity of FIFO buffer circuit 106. According to other examples, the Pre-data and the Post-data together have less than the maximum amount of data that can be stored in FIFO buffer circuit 106 at one time.

In some exemplary implementations of signal analyzer circuit 100, more data than can be stored in FIFO buffer circuit 106 at one time may need to be analyzed for debugging purposes (e.g., multiple frames of video data). FIG. 2 also illustrates opportunistic data received before and after the Pre-data and Post-data stored in FIFO buffer circuit 106. The opportunistic data on the left side of FIFO buffer circuit 106 is opportunistic data that will be stored in FIFO buffer circuit 106 and transmitted to external memory circuit 109 through communication channel 108. The opportunistic data on the right side of FIFO buffer circuit 106 is opportunistic data that has already been stored in FIFO buffer circuit 106 and that has been read out of FIFO buffer circuit 106 for transmission to external memory circuit 109 through communication channel 108. FIG. 2 also illustrates data lost before and after the opportunistic data. The data lost is opportunistic data that is not stored in FIFO buffer circuit 106.

The opportunistic data stored in FIFO buffer circuit 106 may be continuously streamed out of FIFO buffer circuit 106 to data logic circuit 107 as bandwidth allows. In some examples, data logic circuit 107 may store only a filtered subset of the opportunistic data stored in FIFO buffer circuit 106 (e.g., in a subset of the clock cycles) based on the output signals of circuits 103-104 indicating that one or more of the trigger and/or storage qualifier conditions have been satisfied. In these examples, the subset of the data from FIFO buffer circuit 106 that is stored in data logic circuit 107 is selected based on one or more of the trigger and/or storage qualifier conditions being satisfied. Thus, in some exemplary implementations of signal analyzer circuit 100, the opportunistic data indicated by the opportunistic data input signals are filtered prior to being stored in FIFO buffer circuit 106 and after being read from FIFO buffer circuit 106.

The data logic circuit 107 may perform various logic functions on the opportunistic data stored in data logic circuit 107. For example, data logic circuit 107 may encode or decode the opportunistic data using one or more error correction codes. As another example, data logic circuit 107 may compress or decompress the opportunistic data using one or more data compression/decompression techniques. As yet another example, data logic circuit 107 may rank the opportunistic data according to predefined ranking criteria. As a more specific example, data logic circuit 107 may correlate the filtered opportunistic data received from FIFO buffer circuit 106 with the continuous data stored in buffer offload logic circuit 102, such that the opportunistic data and the continuous data can be plotted together by computer 110 using a visualization tool, such as a waveform viewer. Data logic circuit 107 may correlate the opportunistic data with the continuous data using, for example, timestamps or embedded synchronization control codes.

The data logic circuit 107 provides the opportunistic data stored in data logic circuit 107 to communication channel 108 based on predefined rules and based on the available communication channel bandwidth of communication channel 108. The predefined rules may, for example, be based on the output signals of circuits 103-104 indicating the states of one or more of the trigger and/or storage qualifier conditions. The opportunistic data provided from data logic circuit 107 to communication channel 108 may be encoded, decoded, compressed, decompressed, ranked, and/or correlated, as described above. The opportunistic data received from FIFO buffer circuit 106 may be streamed continuously through communication channel 108 to external memory 109. The communication channel 108 may provide the opportunistic data and the continuous data to external memory circuit 109 for storage in external memory circuit 109.

If the communication channel 108 backpressures due to the available bandwidth of the communication channel 108 being less than the amount of data being received from offload buffer logic circuit 102 and data logic circuit 107, the opportunistic data can either be consumed from FIFO buffer circuit 106 and discarded, or alternatively, be held in FIFO buffer circuit 106. Backpressure of data may, for example, be indicated by signals provided from communication channel 108 to FIFO buffer circuit 106 to indicate when the communication channel 108 is able to receive input data. These signals may indicate to FIFO buffer circuit 106 when to start and stop sending data.

According to some examples, the opportunistic data may be held in the FIFO buffer circuit 106 if the opportunistic data stored in the FIFO buffer circuit 106 satisfies or matches one of the trigger and/or storage qualifier conditions monitored by circuits 103-104. According to other examples, if opportunistic data satisfying or matching multiple trigger and/or storage qualifier conditions is stored in the FIFO buffer circuit 106, the Pre-data/Post-data requirement for the trigger or storage qualifier condition having the highest priority is used to determine which opportunistic data stored in the FIFO buffer circuit 106 is held in the FIFO buffer circuit 106. The remaining opportunistic data stored in the FIFO buffer circuit 106 may be discarded.

The opportunistic data and the continuous data stored in the external memory circuit 109 may be provided from external memory circuit 109 to the computer 110 for processing and analysis for debugging purposes. For example, the opportunistic data, the Pre-data, and the Post-data for a number of data blocks, as shown in FIG. 2, may be displayed using a visualization tool running as software on computer 110. Computer 110 may record and display the clock cycles of data lost in the opportunistic data received in the opportunistic data input signals.

Figure 3:
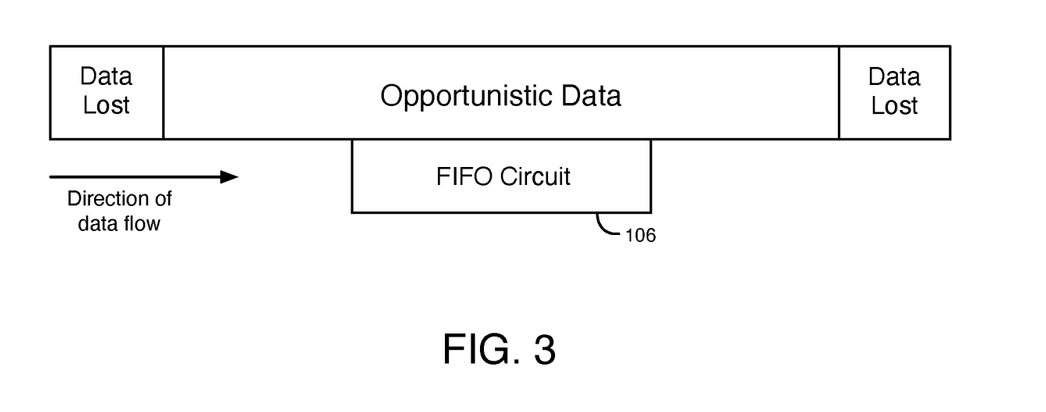
FIG. 3 illustrates an exemplary stream of opportunistic data that is stored in the FIFO buffer circuit when no trigger or storage qualifier conditions are applied to the opportunistic data.

If no trigger or storage qualifier conditions are applied to the opportunistic data, the data stored in the FIFO buffer circuit 106 is considered opportunistic, but the full memory depth of samples of the opportunistic data stored in the FIFO buffer circuit 106 is continuously delivered as bursts of recorded data to the external memory 109. FIG. 3 illustrates an example of opportunistic data that is stored in the FIFO buffer circuit 106 when no trigger or storage qualifier conditions are applied to the opportunistic data. As shown in FIG. 3, the opportunistic data includes data currently stored in the FIFO buffer circuit 106 (above the FIFO buffer circuit in FIG. 3), data that will be stored in the FIFO buffer circuit 106 in the future (to the left of the FIFO buffer circuit in FIG. 3), and data that has been accessed from the FIFO buffer circuit 106 (to the right of the FIFO buffer circuit in FIG. 3). The data lost shown in FIG. 3 is not stored in the FIFO buffer circuit 106. The final full data captured and displayed in the visualization tool includes a series of opportunistic data without the data lost shown in FIGS. 2-3. Information about the data lost may be indicated in the visualization tool. For example, the visualization tool may indicate the amount of data lost and/or the number of clock cycles during which data was not captured by the FIFO buffer circuit 106.

As discussed above, signal analyzer circuit 100 may be in a programmable integrated circuit (IC). Programmable ICs may be reconfigured, or partially reconfigured, to change the functionality of some or all of the programmable logic circuits in the IC by loading new configuration bits into the IC. According to some examples of signal analyzer circuit 100, the memory capacity (e.g., the memory depth and/or width) of FIFO buffer circuit 106 may be changed if signal analyzer circuit 100 is in a programmable IC by reconfiguring the IC or reconfiguring signal analyzer circuit 100 using partial reconfiguration. In these examples, the memory capacity of FIFO buffer circuit 106 may be increased or decreased by reconfiguring or partially reconfiguring the IC (e.g., by changing the memory width and/or depth of the FIFO).

According to other examples of signal analyzer circuit 100, the programmable IC may be reconfigured or partially reconfigured to change which monitored circuits 120 in the IC are sending one or more of the continuous data input signals, the opportunistic data input signals, the storage qualifier input signals, and/or the trigger input signals to signal analyzer circuit 100. According to other examples of signal analyzer circuit 100, the programmable IC may be reconfigured or partially reconfigured to change the storage qualifier conditions that storage qualifier logic circuit 103 compares to the storage qualifier input signals. According to other examples of signal analyzer circuit 100, the programmable IC may be reconfigured or partially reconfigured to change the trigger conditions that the trigger logic circuit 104 compares to the trigger input signals. According to other examples of signal analyzer circuit 100, the programmable IC may be reconfigured or partially reconfigured to change the data transmission protocol (e.g., between PCIe, Ethernet, USB, DDR, etc.) that the communication channel 108 uses to transfer data to external memory 109.

According to other examples of signal analyzer circuit 100, FIFO buffer circuit 106 may include multiple FIFO circuits (e.g., 2, 3, 4, 5, 6, or more FIFO circuits) that store the opportunistic data and multiplexer circuits. A first subset of the multiplexers directs the opportunistic data input signals to selected ones of the FIFO circuits for storage, and a second subset of the multiplexers directs the outputs of the FIFO circuits to the data logic circuit 107. If the IC containing signal analyzer circuit 100 is a programmable IC, the number of FIFO circuits in FIFO buffer circuit 106 may be changed by reconfiguring or partially reconfiguring the programmable IC.

In other examples, circular buffer circuit 101 may include multiple circular buffer circuits that store the continuous input data signals and multiplexer circuits. A first subset of the multiplexers directs the continuous data input signals to selected ones of the circular buffer circuits for storage, and a second subset of the multiplexers directs the outputs of the circular buffer circuits to the buffer offload logic circuit 102. If the IC containing signal analyzer circuit 100 is a programmable IC, the number of circular buffer circuits may be changed by reconfiguring or partially reconfiguring the programmable IC.

Figure 4:
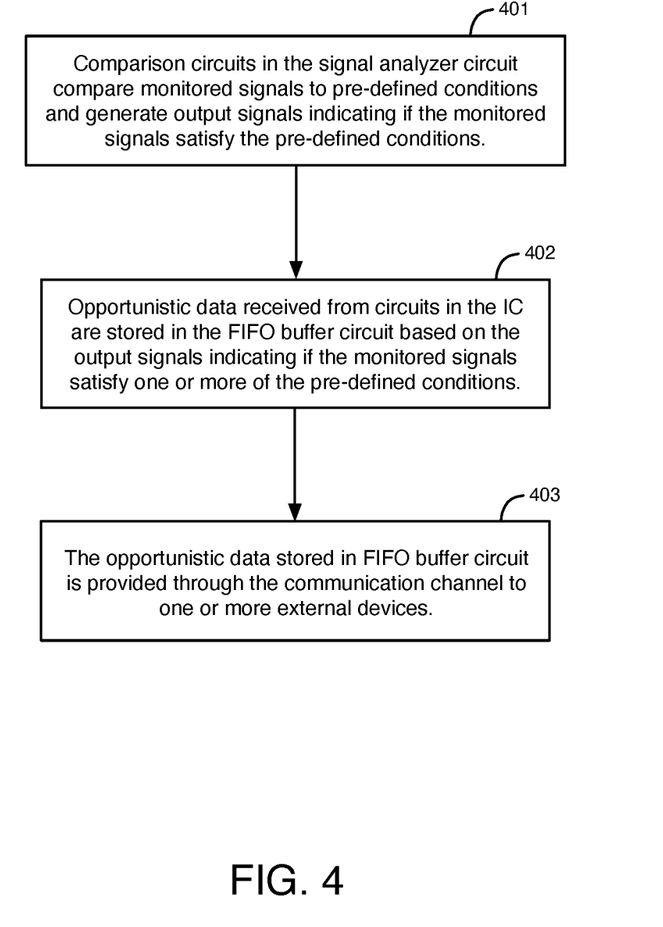
FIG. 4 illustrates examples of operations that may be performed by the signal analyzer circuit of FIG. 1 to process opportunistic data.

FIG. 4 illustrates examples of operations that may be performed by signal analyzer circuit 100 to process opportunistic data. In operation 401, comparison circuits in the signal analyzer circuit 100 compare monitored signals to pre-defined conditions and generate output signals indicating if the monitored signals satisfy the pre-defined conditions. For example, storage qualifier logic circuit 103 may include a comparison circuit that compares the storage qualifier input signals to storage qualifier conditions, and the trigger logic circuit 104 may include a comparison circuit that compares the trigger input signals to trigger conditions. The buffer control logic circuit 105 generates output signals indicating if the storage qualifier input signals satisfy the storage qualifier conditions and/or if the trigger input signals satisfy the trigger conditions. In operation 402, opportunistic data received from circuits in the IC are stored in the FIFO buffer circuit 106 based on the output signals indicating if the monitored signals satisfy one or more of the pre-defined conditions. In operation 403, the opportunistic data stored in FIFO buffer circuit 106 are provided through communication channel 108 to one or more external devices, such as external memory device 109 and/or computer 110. A filtered subset of the opportunistic data stored in FIFO buffer circuit 106 is provided to data logic circuit 107. Data logic circuit 107 may perform one or more processing functions on the filtered subset of the opportunistic data, as described in further detail above.

Figure 5:
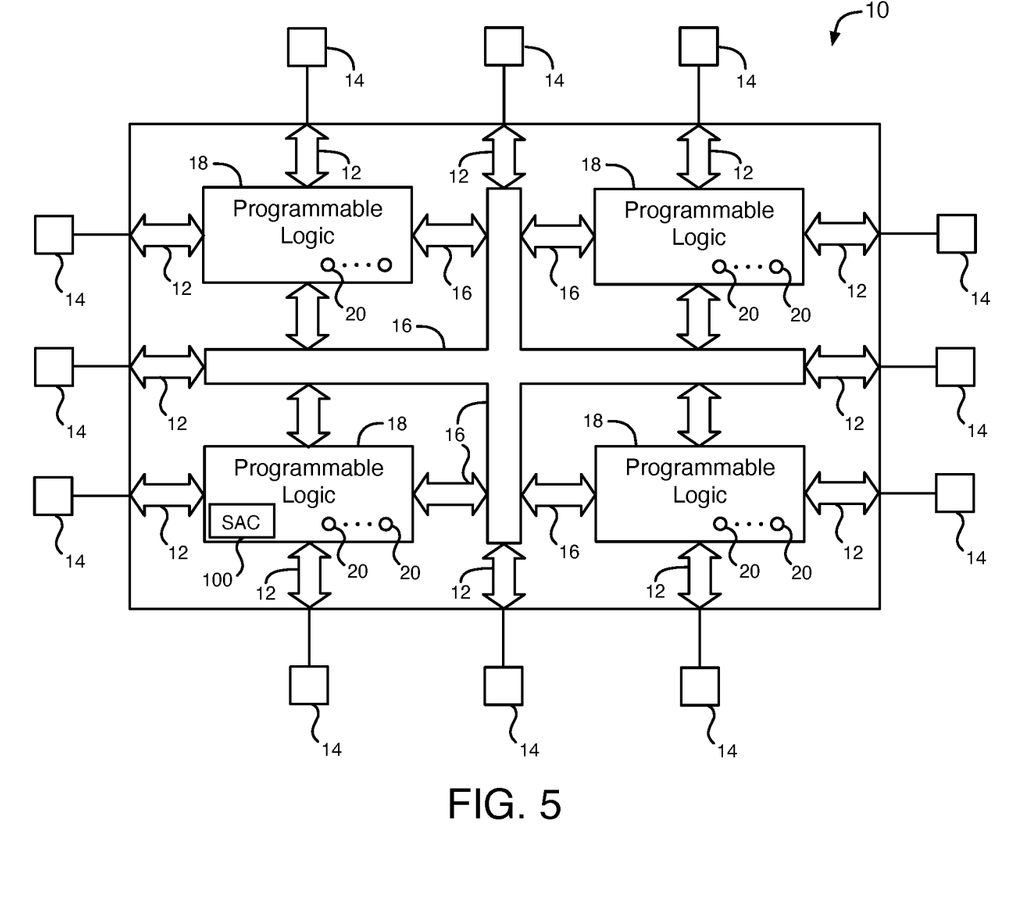
FIG. 5 is a diagram of an illustrative example of a programmable integrated circuit.

An illustrative programmable logic integrated circuit (IC) 10 that includes one or more signal analyzer circuits 100 is shown in FIG. 5. Although one signal analyzer circuit (SAC) 100 is shown in FIG. 5, IC 10 may have any suitable number of signal analyzer circuits 100. As shown in FIG. 5, programmable logic integrated circuit 10 may have input-output circuitry 12 for driving signals off of IC 10 and for receiving signals from other devices via input-output pads 14. SAC circuit 100 may use input-output circuitry 12 and input-output pads 14 to provide data to external memory 109. Interconnection resources 16 such as global, regional, and local vertical and horizontal conductive lines and buses may be used to route signals on IC 10. Interconnection resources 16 include fixed interconnects (conductive lines) and programmable interconnects (i.e., programmable connections between respective fixed interconnects). Programmable logic circuitry 18 may include combinational and sequential logic circuitry. The programmable logic circuitry 18 may be configured to perform custom logic functions according to a custom design for IC 10.

Programmable logic IC 10 contains memory elements 20 that can be loaded with configuration data (also called programming data) using pads 14 and input-output circuitry 12. Once loaded, the memory elements 20 may each provide a corresponding static control output signal that controls the state of an associated logic component in programmable logic circuitry 18. Typically, the memory element output signals are used to control the gates of metal-oxide-semiconductor (MOS) transistors. In the context of programmable integrated circuits, memory elements 20 store configuration data and are sometimes referred to as configuration random-access memory (CRAM) cells.

In general, software and data for performing any of the functions disclosed herein (e.g., by buffer control logic 105 and/or data logic 107) may be stored in non-transitory computer readable storage media. Non-transitory computer readable storage media is tangible computer readable storage media that stores data for a significant period of time, as opposed to media that only transmits propagating electrical signals (e.g., wires). The software code may sometimes be referred to as software, data, program instructions, instructions, or code. The non-transitory computer readable storage media may include computer memory chips, non-volatile memory such as non-volatile random-access memory (NVRAM), one or more hard drives (e.g., magnetic drives or solid state drives), one or more removable flash drives or other removable media, compact discs (CDs), digital versatile discs (DVDs), Blu-ray discs (BDs), other optical media, and floppy diskettes, tapes, or any other suitable memory or storage device(s).

Example 1 is an integrated circuit comprising: a monitored circuit; and a signal analyzer circuit comprising a first logic circuit that determines if a first condition signal satisfies a first condition to generate a first output signal, a first-in-first-out (FIFO) buffer circuit that stores opportunistic data indicated by a monitored signal received from the monitored circuit in response to the first output signal indicating if the first condition signal satisfies the first condition, and a communication channel that transmits the opportunistic data stored in the FIFO buffer circuit to a storage location.

In Example 2, the integrated circuit of Example 1 may optionally include, wherein the signal analyzer circuit further comprises: a data logic circuit that stores a subset of the opportunistic data received from the FIFO buffer circuit based on the first output signal indicating that the first condition signal satisfies the first condition, wherein the data logic circuit provides the subset of the opportunistic data to the communication channel for transmission outside the integrated circuit.

In Example 3, the integrated circuit of any one of Examples 1-2 may optionally include, wherein the signal analyzer circuit further comprises: an additional monitored circuit; a circular buffer circuit that stores continuous data received from the additional monitored circuit based on the first output signal; and a data logic circuit that correlates timing of the opportunistic data received from the FIFO buffer circuit with timing of the continuous data stored in the circular buffer circuit, wherein the data logic circuit provides a subset of the opportunistic data to the communication channel, and wherein the communication channel transmits the subset of the opportunistic data and the continuous data to the storage location.

In Example 4, the integrated circuit of any one of Examples 1-3 may optionally include, wherein the signal analyzer circuit further comprises: a second logic circuit that determines if a second condition signal satisfies a storage qualifier condition to generate a second output signal, wherein the first logic circuit compares the first condition signal to a trigger condition to generate the first output signal.

In Example 5, the integrated circuit of Example 4 may optionally include, wherein the FIFO buffer circuit stores a first subset of the opportunistic data based on the first output signal indicating that the first condition signal satisfies the trigger condition, and wherein the FIFO buffer circuit stores a second subset of the opportunistic data based on the second output signal indicating that the second condition signal satisfies the storage qualifier condition.

In Example 6, the integrated circuit of any one of Examples 2-3 may optionally include, wherein the data logic circuit performs one of encoding, decoding, data compression, data decompression, or ranking of the subset of the opportunistic data received from the FIFO buffer circuit to generate output data that is provided to the communication channel for transmission outside the integrated circuit.

In Example 7, the integrated circuit of any one of Examples 1-6 may optionally include, wherein the FIFO buffer circuit has a variable storage capacity that is varied by reconfiguring the signal analyzer circuit, wherein the integrated circuit is a programmable integrated circuit, and wherein the monitored circuit and the signal analyzer circuit comprise programmable logic circuits that are configurable according to a custom design for the programmable integrated circuit.

In Example 8, the integrated circuit of any one of Examples 1-7 may optionally include, wherein the FIFO buffer circuit stores a first subset of the opportunistic data that is received before the first condition signal satisfies the first condition, and wherein the FIFO buffer circuit stores a second subset of the opportunistic data that is received after the first condition signal satisfies the first condition.

Example 9 is a method for accessing a monitored signal generated by a monitored circuit in an integrated circuit, the method comprising: comparing a first condition signal to a first condition using a first comparison circuit in the integrated circuit to generate a first output signal; storing opportunistic data indicated by the monitored signal received from the monitored circuit in a first-in-first-out (FIFO) buffer circuit in the integrated circuit based on the first output signal indicating if the first condition signal satisfies the first condition; and transmitting the opportunistic data stored in the FIFO buffer circuit outside the integrated circuit using a communication channel in the integrated circuit.

In Example 10, the method of Example 9 may optionally further comprise: comparing a second condition signal to a storage qualifier condition using a second comparison circuit in the integrated circuit to generate a second output signal; and wherein comparing the first condition signal to the first condition using the first comparison circuit further comprises comparing the first condition signal to a trigger condition to generate the first output signal.

In Example 11, the method of Example 10 may optionally include, wherein storing the opportunistic data indicated by the monitored signal received from the monitored circuit in the FIFO buffer circuit further comprises storing a first subset of the opportunistic data in the FIFO buffer circuit based on the first output signal indicating that the first condition signal satisfies the trigger condition and storing a second subset of the opportunistic data in the FIFO buffer circuit based on the second output signal indicating that the second condition signal satisfies the storage qualifier condition.

In Example 12, the method of Example 11 may optionally further comprise: storing a filtered subset of the opportunistic data received from the FIFO buffer circuit in a data logic circuit based on at least one of the first output signal or the second output signal; and providing the filtered subset of the opportunistic data from the data logic circuit to the communication channel for transmission outside the integrated circuit.

In Example 13, the method of any one of Examples 9-12 may optionally include, wherein the integrated circuit is a programmable integrated circuit, and wherein the monitored circuit comprises programmable logic circuits that are configurable according to a custom design for the programmable integrated circuit.

In Example 14, the method of any one of Examples 9-13 may optionally further comprise: varying a depth and width of the FIFO buffer circuit by reconfiguring the FIFO buffer circuit using partial reconfiguration of the programmable integrated circuit.

In Example 15, the method of any one of Examples 9-14 may optionally further comprise: changing the first condition to a second condition using partial reconfiguration of the programmable integrated circuit; and comparing the second condition to the first condition signal using the first comparison circuit to generate the first output signal, wherein storing the opportunistic data further comprises storing the opportunistic data in the FIFO buffer circuit based on the first output signal indicating if the first condition signal satisfies the second condition.

In Example 16, the method of Example 15 may optionally further comprise: providing an additional monitored signal from an additional monitored circuit to the FIFO buffer circuit after partial reconfiguration of the programmable integrated circuit; and storing additional opportunistic data indicated by the additional monitored signal in the FIFO buffer circuit based on the first output signal indicating if the first condition signal satisfies the second condition.

Example 17 is an electronic circuit system comprising: a memory circuit; and an integrated circuit comprising: monitored circuits; and a signal analyzer circuit comprising a first logic circuit that determines if a first condition signal satisfies a first condition to generate a first output signal, a first-in-first-out (FIFO) buffer circuit that stores opportunistic data indicated by a monitored signal received from at least one of the monitored circuits based on the first output signal indicating if the first condition signal satisfies the first condition, a data logic circuit that stores a subset of the opportunistic data received from the FIFO buffer circuit, and a communication channel that transmits the opportunistic data from the data logic circuit to the memory circuit.

In Example 18, the electronic circuit system of Example 17 may optionally include, wherein the data logic circuit stores the subset of the opportunistic data received from the FIFO buffer circuit that is filtered from the opportunistic data based on the first output signal indicating that the first condition signal satisfies the first condition.

In Example 19, the electronic circuit system of any one of Examples 17-18 may optionally include, wherein the signal analyzer circuit further comprises a second logic circuit that determines if a second condition signal satisfies a second condition to generate a second output signal, and wherein the FIFO buffer circuit stores the opportunistic data based on at least one of the first output signal indicating that the first condition signal satisfies the first condition or the second output signal indicating that the second condition signal satisfies the second condition.

In Example 20, the electronic circuit system of any one of Examples 17-19 may optionally include, wherein the FIFO buffer circuit has a variable storage capacity that is varied by reconfiguring programmable circuits in the signal analyzer circuit using partial reconfiguration.

The foregoing description of the exemplary embodiments has been presented for the purpose of illustration. The foregoing description is not intended to be exhaustive or to be limiting to the examples disclosed herein. In some instances, various features can be employed without a corresponding use of other features as set forth. Many modifications, substitutions, and variations are possible in light of the above teachings, without departing from the scope of the present embodiments.

What is claimed is:

1. An integrated circuit comprising:
   a monitored circuit; and
   a signal analyzer circuit comprising a first logic circuit that determines if a first condition signal satisfies a first condition to generate a first output signal, a first-in-first-out (FIFO) buffer circuit that stores opportunistic data indicated by a monitored signal received from the monitored circuit in response to the first output signal indicating if the first condition signal satisfies the first condition, and a communication channel that transmits the opportunistic data stored in the FIFO buffer circuit to a storage location,
   wherein the FIFO buffer circuit stores a first subset of the opportunistic data that is received before the first condition signal satisfies the first condition, and wherein the FIFO buffer circuit stores a second subset of the opportunistic data that is received after the first condition signal satisfies the first condition.

2. The integrated circuit of claim 1, wherein the signal analyzer circuit further comprises:
   a data logic circuit that stores the first subset of the opportunistic data received from the FIFO buffer circuit based on the first output signal indicating that the first condition signal satisfies the first condition, wherein the data logic circuit provides the first subset of the opportunistic data to the communication channel for transmission outside the integrated circuit.

3. The integrated circuit of claim 1, wherein the signal analyzer circuit further comprises:
   an additional monitored circuit;
   a circular buffer circuit that stores continuous data received from the additional monitored circuit based on the first output signal; and
   a data logic circuit that correlates timing of the opportunistic data received from the FIFO buffer circuit with timing of the continuous data stored in the circular buffer circuit, wherein the data logic circuit provides a portion of the opportunistic data to the communication channel, and wherein the communication channel transmits the portion of the opportunistic data and the continuous data to the storage location.

4. The integrated circuit of claim 1, wherein the signal analyzer circuit further comprises:
   a second logic circuit that determines if a second condition signal satisfies a storage qualifier condition to generate a second output signal, wherein the first logic circuit compares the first condition signal to a trigger condition to generate the first output signal.

5. The integrated circuit of claim 4, wherein the FIFO buffer circuit stores the first subset of the opportunistic data based on the first output signal indicating that the first condition signal satisfies the trigger condition, and wherein the FIFO buffer circuit stores the second subset of the opportunistic data based on the second output signal indicating that the second condition signal satisfies the storage qualifier condition.

6. The integrated circuit of claim 2, wherein the data logic circuit performs one of encoding, decoding, data compression, data decompression, or ranking of the first subset of the opportunistic data received from the FIFO buffer circuit to generate output data that is provided to the communication channel for transmission outside the integrated circuit.

7. The integrated circuit of claim 1, wherein the FIFO buffer circuit has a variable storage capacity that is varied by reconfiguring the signal analyzer circuit, wherein the integrated circuit is a programmable integrated circuit, and wherein the monitored circuit and the signal analyzer circuit comprise programmable logic circuits that are configurable according to a custom design for the programmable integrated circuit.

8. The integrated circuit of claim 1, wherein the integrated circuit is a programmable integrated circuit, and wherein the monitored circuit comprises programmable logic circuits.

9. A method for accessing a monitored signal generated by a monitored circuit in an integrated circuit, the method comprising:
comparing a first condition signal to a trigger condition using a first comparison circuit in the integrated circuit to generate a first output signal;
storing opportunistic data indicated by the monitored signal received from the monitored circuit in a first-in-first-out (FIFO) buffer circuit in the integrated circuit based on the first output signal indicating if the first condition signal satisfies the trigger condition;
transmitting the opportunistic data stored in the FIFO buffer circuit outside the integrated circuit using a communication channel in the integrated circuit; and
comparing a second condition signal to a storage qualifier condition using a second comparison circuit in the integrated circuit to generate a second output signal.

10. The method of claim 9, wherein storing the opportunistic data indicated by the monitored signal received from the monitored circuit in the FIFO buffer circuit further comprises:
storing a first subset of the opportunistic data that is received before the first condition signal satisfies the trigger condition in the FIFO buffer circuit; and
storing a second subset of the opportunistic data that is received after the first condition signal satisfies the trigger condition in the FIFO buffer circuit.

11. The method of claim 9, wherein storing the opportunistic data indicated by the monitored signal received from the monitored circuit in the FIFO buffer circuit further comprises storing a first subset of the opportunistic data in the FIFO buffer circuit based on the first output signal indicating that the first condition signal satisfies the trigger condition and storing a second subset of the opportunistic data in the FIFO buffer circuit based on the second output signal indicating that the second condition signal satisfies the storage qualifier condition.

12. The method of claim 11 further comprising:
storing a filtered subset of the opportunistic data received from the FIFO buffer circuit in a data logic circuit based on at least one of the first output signal or the second output signal; and
providing the filtered subset of the opportunistic data from the data logic circuit to the communication channel for transmission outside the integrated circuit.

13. The method of claim 9, wherein the integrated circuit is a programmable integrated circuit, and wherein the monitored circuit comprises programmable logic circuits that are configurable according to a custom design for the programmable integrated circuit.

14. The method of claim 13 further comprising:
varying a depth and width of the FIFO buffer circuit by reconfiguring the FIFO buffer circuit using partial reconfiguration of the programmable integrated circuit.

15. The method of claim 13 further comprising:
changing the trigger condition to a third condition using partial reconfiguration of the programmable integrated circuit; and
comparing the third condition to the first condition signal using the first comparison circuit to generate the first output signal, wherein storing the opportunistic data further comprises storing the opportunistic data in the FIFO buffer circuit based on the first output signal indicating if the first condition signal satisfies the third condition.

16. The method of claim 15 further comprising:
providing an additional monitored signal from an additional monitored circuit to the FIFO buffer circuit after partial reconfiguration of the programmable integrated circuit; and
storing additional opportunistic data indicated by the additional monitored signal in the FIFO buffer circuit based on the first output signal indicating if the first condition signal satisfies the third condition.

17. An electronic circuit system comprising:
a memory circuit; and
an integrated circuit comprising:
monitored circuits; and
a signal analyzer circuit comprising a first logic circuit that determines if a first condition signal satisfies a first condition to generate a first output signal, a first-in-first-out (FIFO) buffer circuit that stores opportunistic data indicated by a monitored signal received from at least one of the monitored circuits based on the first output signal indicating if the first condition signal satisfies the first condition, a data logic circuit that stores a subset of the opportunistic data received from the FIFO buffer circuit, and a communication channel that transmits the subset of the opportunistic data from the data logic circuit to the memory circuit, and wherein the FIFO buffer circuit has a variable storage capacity that is varied by reconfiguring programmable circuits in the signal analyzer circuit using partial reconfiguration.

18. The electronic circuit system of claim 17, wherein the data logic circuit stores the subset of the opportunistic data received from the FIFO buffer circuit that is filtered from the opportunistic data based on the first output signal indicating that the first condition signal satisfies the first condition.

19. The electronic circuit system of claim 17, wherein the signal analyzer circuit further comprises a second logic circuit that determines if a second condition signal satisfies a second condition to generate a second output signal, and wherein the FIFO buffer circuit stores the opportunistic data based on the first output signal indicating that the first condition signal satisfies the first condition and the second output signal indicating that the second condition signal satisfies the second condition.

20. The electronic circuit system of claim 17, wherein the integrated circuit is a programmable integrated circuit.

* * * * *